US011961586B2

(12) United States Patent
Yamamoto

(10) Patent No.: US 11,961,586 B2
(45) Date of Patent: Apr. 16, 2024

(54) SEMICONDUCTOR DEVICE, MEMORY SYSTEM, AND METHOD OF CORRECTING DUTY CYCLE OF OUTPUT SIGNAL FROM SEMICONDUCTOR DEVICE

(71) Applicant: Kioxia Corporation, Tokyo (JP)

(72) Inventor: Kensuke Yamamoto, Yokohama (JP)

(73) Assignee: Kioxia Corporation, Tokyo (JP)

(*) Notice: Subject to any disclaimer, the term of this patent is extended or adjusted under 35 U.S.C. 154(b) by 180 days.

(21) Appl. No.: 17/577,650

(22) Filed: Jan. 18, 2022

(65) Prior Publication Data

US 2023/0070380 A1    Mar. 9, 2023

(30) Foreign Application Priority Data

Sep. 8, 2021  (JP) ................................ 2021-146470

(51) Int. Cl.
*G11C 7/22*  (2006.01)
*G11C 16/32*  (2006.01)

(52) U.S. Cl.
CPC ................ *G11C 7/22* (2013.01); *G11C 16/32* (2013.01)

(58) Field of Classification Search
CPC ........... G11C 7/22; G11C 16/32; G11C 7/222; G11C 7/1063; G11C 7/1066; G11C 7/1093; G11C 16/26; G11C 16/0483
See application file for complete search history.

(56) References Cited

U.S. PATENT DOCUMENTS

| | | | |
|---|---|---|---|
| 10,720,221 B2 | 7/2020 | Yamamoto et al. | |
| 11,177,008 B2 | 11/2021 | Yamamoto et al. | |
| 2013/0043922 A1* | 2/2013 | Srivastava | H03K 19/0013 327/333 |
| 2019/0227939 A1* | 7/2019 | Park | G06F 13/1673 |
| 2020/0303021 A1* | 9/2020 | Yamamoto | G11C 29/028 |
| 2021/0271615 A1* | 9/2021 | Yamamoto | G06F 13/1689 |

FOREIGN PATENT DOCUMENTS

JP    2019-128829 A    8/2019

* cited by examiner

*Primary Examiner* — Jay W. Radke
(74) *Attorney, Agent, or Firm* — Oblon, McClelland, Maier & Neustadt, L.L.P.

(57) ABSTRACT

A semiconductor device according to an embodiment includes: a logic control circuit to which a signal is input; a timing information storage circuit configured to store timing information related to a start timing of correction processing that corrects a duty cycle of the signal; and a sequencer configured to start execution of the correction processing based on the timing information when a command related to the execution of the correction processing is received.

12 Claims, 15 Drawing Sheets

SEMICONDUCTOR DEVICE, MEMORY SYSTEM, AND METHOD OF CORRECTING DUTY CYCLE OF OUTPUT SIGNAL FROM SEMICONDUCTOR DEVICE

CROSS-REFERENCE TO RELATED APPLICATION

This application is based upon and claims the benefit of priority from the prior Japanese Patent Application No. 2021-146470 filed in Japan on Sep. 8, 2021; the entire contents of which are incorporated herein by reference.

FIELD

An embodiment relates to a semiconductor device, a memory system, and a method of correcting a duty cycle of an output signal from a semiconductor device.

BACKGROUND

A duty cycle of an output signal generated by and output from a semiconductor device varies due to temperature and the like. Thus, duty cycle correction processing is performed in accordance with a command from a controller.

DETAILED DESCRIPTION

A semiconductor device in an embodiment includes: an input circuit to which a signal is input; a timing information storage circuit configured to store timing information related to a start timing of correction processing that corrects a duty cycle of the signal; and a control circuit configured to start execution of the correction processing based on the timing information when a command related to the execution of the correction processing is received.

Peak current occurs when the duty cycle correction processing is simultaneously executed at a plurality of semiconductor devices based on an execution command of the duty cycle correction processing. Furthermore, a total processing time period increases when the plurality of semiconductor devices are caused to execute the duty cycle correction processing by issuing an execution command of the duty cycle correction processing for each semiconductor device to avoid occurrence of peak current.

An embodiment described below provides a semiconductor device that can prevent occurrence of peak current and execute the duty cycle correction processing at a plurality of semiconductor devices in a short time period, and a method of correcting the duty cycle of an output signal from the semiconductor device.

The embodiment will be described below with reference to the drawings.

Configuration

Figure 1:
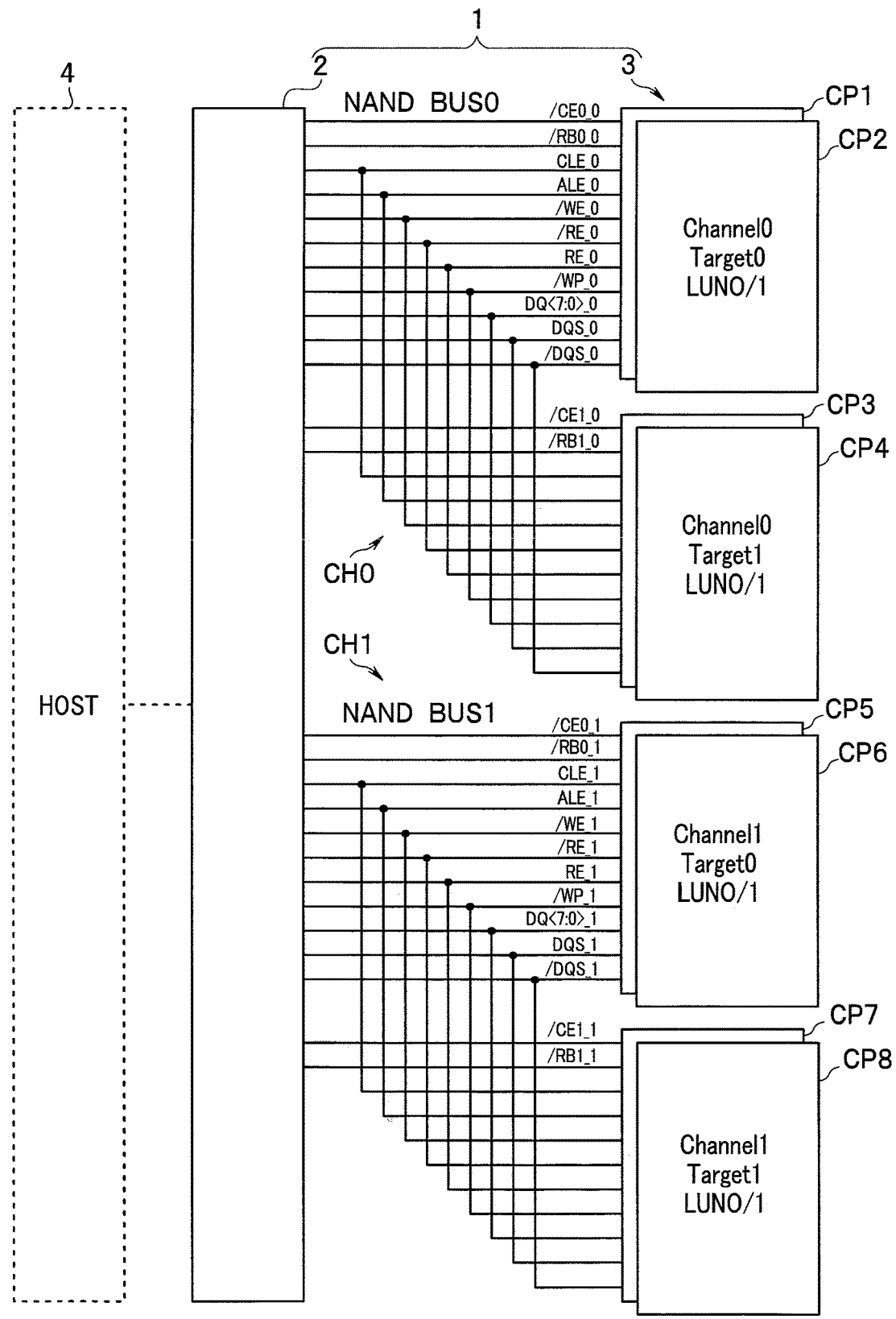
FIG. 1 is a configuration diagram of a memory system according to an embodiment.

FIG. 1 is a configuration diagram of a memory system according to the present embodiment. The memory system 1 includes a controller 2 and a semiconductor storage device group 3. The controller 2 is connected to a host 4 illustrated with a dotted line. The memory system 1 performs, in accordance with a request from the host 4, user data writing to the semiconductor storage device group 3 and user data reading from the semiconductor storage device group 3.

The semiconductor storage device group 3 includes a plurality (in this example, eight) of semiconductor storage devices CP1 to CP8. The eight semiconductor storage devices CP1 to CP8 are connected to the controller 2. FIG. 1 illustrates a configuration in which the controller 2 is connected to the eight semiconductor storage devices CP1 to CP8 through two channels CH0 and CH1.

The eight semiconductor storage devices CP1 to CP8 are each one semiconductor chip to which a logical unit number (hereinafter, referred to as LUN) is set as a chip address (CA) in advance. Each LUN is set to a LUN setting circuit 24 to be described later. Each LUN is a unit in which a predetermined command is individually executed, and specifies a semiconductor storage device at which the command is executed at a target selected by a chip enable CE signal.

In the memory system 1, the semiconductor storage devices CP1 to CP8 are each specified by the channels CH0 and CH1, targets T0 and T1, and LUN 0 and 1. A LUN is included in a row address output from the controller 2 when the controller 2 accesses a semiconductor storage device.

As illustrated in FIG. 1, the controller 2 is connected to each of the semiconductor storage devices CP1 to CP8 through NAND buses for respective channels. In other words, the memory system 1 includes a NAND bus for each channel CH. The four semiconductor storage devices CP1 to CP4 are connected to the controller 2 through one NAND bus 0 for the channel CH0. Similarly, the four semiconductor storage devices CP5 to CP8 are connected to the controller 2 through another NAND bus 1 for the channel CH1.

The NAND buses 0 and 1 each include a plurality of signal lines. The NAND bus 0 includes a plurality of signal lines in accordance with a NAND interface. Specifically, signals /CE0_0, /CE1_0, /RB0_0, /RB1_0, CLE_0, ALE_0, /WE_0, /RE_0, RE_0, /WP_0, DQ<7:0>_0, DQS_0, and /DQS_0 are transmitted and received through the NAND bus 0.

The signal /CE0_0 is received by the semiconductor storage devices CP1 and CP2 at a target 0 of the channel CH0. The signal /CE1_0 is received by the semiconductor storage devices CP3 and CP4 at a target 1 of the channel CH0. The signal /RB0_0 from the target 0 of the channel CH0 is received by the controller 2. The signal /RB1_0 from the target 1 of the channel CH0 is received by the controller 2. The signals CLE_0, ALE_0, /WE_0, /RE_0, RE_0, and /WP_0 are received by the semiconductor storage devices CP1 to CP4 of the channel CH0.

Similarly, the NAND bus 1 includes a plurality of signal lines in accordance with a NAND interface. Specifically, signals /CE0_1, /CE1_1, /RB0_1, /RB1_1, CLE_1, ALE_1, /WE_1, /RE_1, RE_1, /WP_1, DQ<7:0>_1, DQS_1, and /DQS_1 are transmitted and received through the NAND bus 1.

The signal /CE0_1 is received by the semiconductor storage devices CP5 and CP6 at a target 0 of the channel CH1. The signal /CE1_1 is received by the semiconductor storage devices CP7 and CP8 at a target 1 of the channel CH1. The signal /RB0_1 from the target 0 of the channel CH1 is received by the controller 2. The signal /RB1_1 from the target 1 of the channel CH1 is received by the controller 2. The signals CLE_1, ALE_1, /WE_1, /RE_1, RE_1, and /WP_1 are received by the semiconductor storage devices CP5 to CP8 of the channel CH1.

The signals /CE0_0, /CE1_0, /CE0_1, and /CE1_1 are each a chip enable signal for enabling the semiconductor storage devices CP1 to CP8.

The signals /RB0_0, /RB1_0, /RB0_1, and /RB1_1 are each a ready/busy signal indicating whether the semiconductor storage devices CP1 to CP8 are in a ready state (in which a command from outside is received) or a busy state (in which no command from outside is received).

In the channel CH0, the signal CLE_0 notifies the semiconductor storage devices CP1 to CP4 that the signal DQ<7:0>_0 received by the semiconductor storage devices CP1 to CP4 while the signal CLE_0 is at a "H (High)" level is a command.

The signal ALE_0 notifies the semiconductor storage devices CP1 to CP4 that the signal DQ<7:0>_0 received by the semiconductor storage devices CP1 to CP4 while the signal ALE_0 is at a "H" level is an address.

The signal /WE_0 instructs the semiconductor storage devices CP1 to CP4 to acquire the signal DQ<7:0>_0 received by the semiconductor storage devices CP1 to CP4 while the signal /WE_0 is at a "L (Low)" level.

The signals /RE_0 and RE_0 instruct the semiconductor storage devices CP1 to CP4 to output the signal DQ<7:0>_0, and are used to control operation timings of the semiconductor storage devices CP1 to CP4, for example, when the signal DQ<7:0>_0 is output.

The signal /WP_0 instructs the semiconductor storage devices CP1 to CP4 to inhibit data writing and erasure.

The signal DQ<7:0>_0 is, for example, an 8-bit signal. The signal DQ<7:0>_0 is an entity of data transmitted and received between each of the semiconductor storage devices CP1 to CP4 and the controller 2, and includes a command, an address and data.

The signals DQS_0 and /DQS_0 can be generated based on, for example, the signals /RE_0 and RE_0 and are used to control the operation timings of the semiconductor storage devices CP1 to CP4 in accordance with the signal DQ<7:0>_0.

The signals CLE_1, ALE_1, /WE_1, /RE_1, RE_1, /WP_1, DQ<7:0>_1, DQS_1, and /DQS_1 in the channel CH1 are same as the signals CLE_0, ALE_0, /WE_0, /RE_0, RE_0, /WP_0, DQ<7:0>_0, DQS_0, and /DQS_0 in the channel CH0 except for different targets, namely, the semiconductor storage devices CP3 and CP4.

Figure 2:
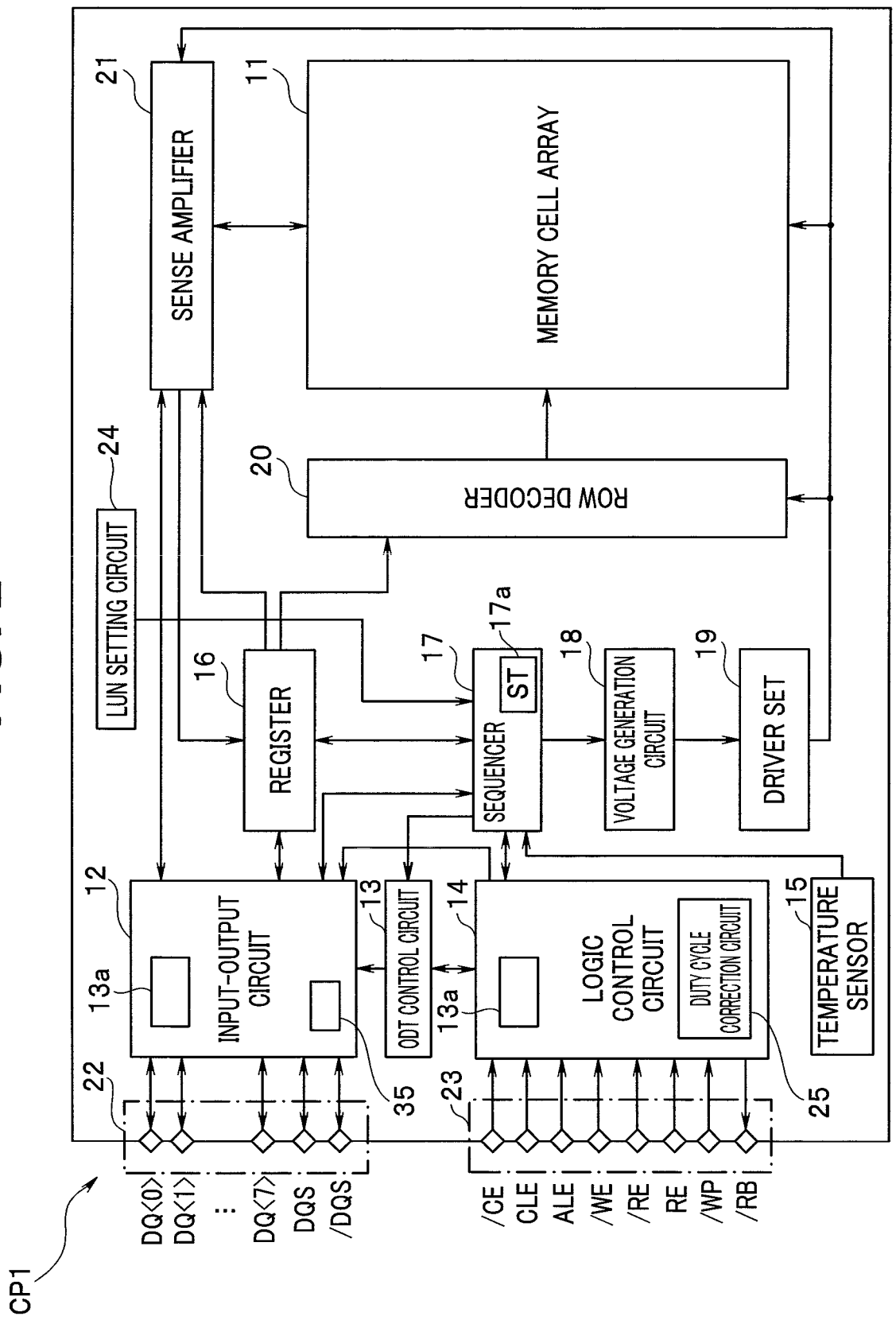
FIG. 2 is a block diagram illustrating a configuration of a semiconductor storage device according to the embodiment.

FIG. 2 is a block diagram illustrating a configuration of each of the semiconductor storage devices CP1 to CP8. The eight semiconductor storage devices CP1 to CP8 have configurations equivalent to each other. Thus, the following description will be made on the configuration of the semiconductor storage device CP1 among the semiconductor storage devices CP1 to CP8, and description of the configurations of the semiconductor storage devices CP2 to CP8 is omitted.

As illustrated in FIG. 2, the semiconductor storage device CP1 includes a memory cell array 11, an input-output circuit 12, an ODT control circuit 13, a logic control circuit 14, a temperature sensor 15, a register 16, a sequencer 17, a voltage generation circuit 18, a driver set 19, a row decoder 20, a sense amplifier 21, an input-output pad group 22, a logic control pad group 23, and the LUN setting circuit 24.

The input-output circuit 12 and the logic control circuit 14 each include an ODT circuit 13a. In addition, the logic control circuit 14 includes a duty cycle correction circuit 25.

The memory cell array 11 includes a plurality of non-volatile memory cells (not illustrated) associated with word lines and bit lines.

The input-output circuit 12 transmits and receives the signal DQ<7:0>_0 to and from the controller 2. The input-output circuit 12 forwards a command and an address in the signal DQ<7:0>_0 to the register 16. The input-output circuit 12 transmits and receives write data and read data to and from the sense amplifier 21.

The ODT control circuit 13 is a circuit configured to prevent (or vanish), by using a terminating resistor, signal reflection that occurs between the semiconductor storage device and outside (the controller 2) at inputting and outputting of data and the like. In the memory system 1, the controller 2 and each semiconductor storage device of a plurality of memory packages are connected in common through the same NAND bus. Thus, reflection of a signal from any non-selected semiconductor storage device propagates to a selected semiconductor storage device to which the signal is input or the controller 2. This signal reflection becomes noise in the input signal. Thus, the signal reflection is prevented by the ODT circuit 13a included in each of the input-output circuit 12 and the logic control circuit 14.

The logic control circuit 14 is an input circuit through which the signals /CE0_0, CLE_0, ALE_0, /WE_0, RE_0, /RE_0, and /WP_0 are input from the controller 2. The logic control circuit 14 forwards the signal /RB0_0 to the controller 2 to externally provide notification of a state of the semiconductor storage device CP1.

The temperature sensor 15 has a function that can measure temperature in the semiconductor storage device CP1. The temperature sensor 15 sends information related to the measured temperature to the sequencer 17. Note that the temperature sensor 15 may be provided at any place in the semiconductor storage device CP1 in a range in which temperature that can be regarded as temperature of the memory cell array 11 can be measured.

The register 16 stores a command and an address. The register 16 forwards the address to the row decoder 20 and the sense amplifier 21 and forwards the command to the sequencer 17.

The sequencer 17 receives the command and controls the entire semiconductor storage device CP1 in accordance with a sequence based on the received command. The sequencer 17 sends the temperature information received from the temperature sensor 15 to the controller 2 through the input-output circuit 12.

Note that a set toggle frequency ST is set to the sequencer 17 in advance as a start timing of the duty cycle correction processing (hereinafter referred to as DCC processing) for each semiconductor storage device. As described later, the set toggle frequency defines a timing at which the semiconductor storage device CP1 starts the DCC processing. In other words, the sequencer 17 includes a timing information storage circuit 17a configured to store the set toggle frequency ST as timing information related to the start timing of the DCC processing that corrects the duty cycle of an output signal. Note that the timing information storage circuit 17a may be provided as a circuit separated from the sequencer 17.

The voltage generation circuit 18 generates, based on an instruction from the sequencer 17, voltage necessary for operation such as data writing, reading, and erasure. The voltage generation circuit 18 supplies the generated voltage to the driver set 19.

The driver set 19 includes a plurality of drivers and supplies various kinds of voltages from the voltage generation circuit 18 to the row decoder 20 and the sense amplifier 21 based on an address from the register 16. For example, the driver set 19 supplies various kinds of voltages to the row decoder 20 based on a row address in the address.

The row decoder 20 receives the row address in the address from the register 16 and selects memory cells on a row based on the row address. Then, voltage from the driver set 19 is transferred to the selected memory cells on the row through the row decoder 20.

At data reading, the sense amplifier 21 senses read data that is read from a memory cell to a bit line, and forwards the sensed read data to the input-output circuit 12. At data writing, the sense amplifier 21 forwards, to a memory cell, write data that is written through a bit line. In addition, the sense amplifier 21 receives a column address in the address from the register 16, and outputs data on a column based on the column address.

The input-output pad group 22 forwards the signals DQ<7:0>_0, DQS_0, and /DQS_0 received from the controller 2 to the input-output circuit 12. In addition, the input-output pad group 22 forwards, to outside of the semiconductor storage device CP1, the signal DQ<7:0>_0 transmitted from the input-output circuit 12.

The logic control pad group 23 forwards the signals /CE0_0, CLE_0, ALE_0, /WE_0, RE_0, /RE_0, and /WP_0 received from the controller 2 to the logic control circuit 14. In addition, the logic control pad group 23 forwards, to outside of the semiconductor storage device CP1, the signal /RB0_0 transmitted from the logic control circuit 14.

The LUN setting circuit 24 includes wires with which bit data for LUNs can be set depending on whether or not wire bonding is provided to a plurality of pins. As described above, each LUN is a chip address and set to the LUN setting circuit 24 as a hardware circuit.

The duty cycle correction circuit (hereinafter abbreviated as DCC circuit) 25 is a circuit configured to correct the duty cycle of the signals RE and /RE input through pads 23_re and 23_bre, respectively, (FIG. 3) in the logic control pad group 23.

Figure 3:
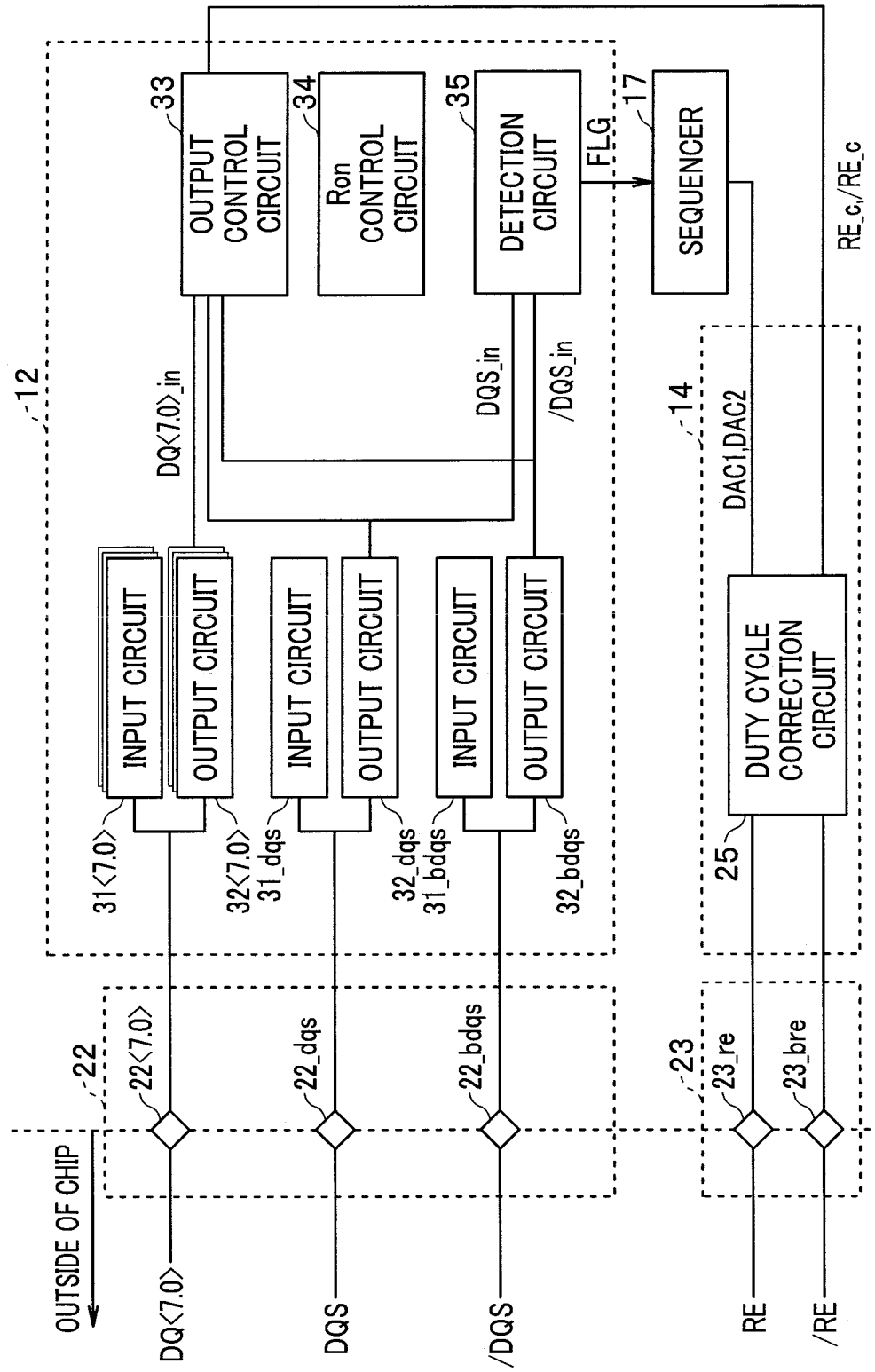
FIG. 3 is a block diagram for description of a configuration related to a duty cycle correction function in an input-output circuit and a logic control circuit of the semiconductor storage device according to the embodiment.

Subsequently, a configuration related to a duty cycle correction function will be described. FIG. 3 is a block diagram for description of a configuration related to the duty cycle correction function in the input-output circuit and the logic control circuit of the semiconductor storage device CP1 according to the embodiment. Note that, in description of FIG. 3, each signal is provided with no reference sign that identifies a channel, and the signals DQ<7:0>_0 and DQ<7:0>_1 are simply referred to as DQ<7:0>, for example.

The duty cycle of an output signal indicates a ratio of a time period from rising of a pulse in the output signal to falling of the pulse relative to one period of the pulse (that is, a ratio of a time period from falling a pulse in the output signal to rising of the pulse relative to one period of the pulse).

As illustrated in FIG. 3, the input-output circuit 12 includes a set including an input circuit 31<7:0> and an output circuit 32<7:0> corresponding to a signal DQ<7:0>. For example, a signal DQ<k> of the same kind is allocated to one set including an input circuit 31<k> and an output circuit 32<k> (0≤k≤7). In other words, the set including the input circuit 31<k> and the output circuit 32<k> can communicate the signal DQ<k> with the controller 2 outside through a pad 22<k> in the input-output pad group 22.

In addition, the input-output circuit 12 includes a set including an input circuit 31_dqs and an output circuit 32_dqs corresponding to a signal DQS. In other words, the set including the input circuit 31_dqs and the output circuit 32_dqs can communicate the signal DQS with the controller 2 outside through a pad 22_dqs in the input-output pad group 22. The input-output circuit 12 also includes a set including an input circuit 31_bdqs and an output circuit 32_bdqs corresponding to a signal /DQS. In other words, the set including the input circuit 31_bdqs and the output circuit 32_bdqs can communicate the signal /DQS with the controller 2 outside through a pad 22_bdqs in the input-output pad group 22.

The input-output circuit 12 further includes an output control circuit 33, a Ron control circuit 34, and a detection circuit 35. The output control circuit 33 generates signals DQ<7:0>_in, DQS_in, and /DQS_in as bases of the signals DQ<7:0>, DQS, and /DQS, and sends the generated signals DQ<7:0>_in, DQS_in, and /DQS_in to the output circuits 32<7:0>, 32_dqs, and 32_bdqs, respectively. The Ron control circuit 34 controls output impedance in the output circuits 32<7:0>, 32_dqs, and 32_bdqs.

The detection circuit 35 detects whether duty cycle correction is needed. Thus, the detection circuit 35 detects the duty cycles of the signals DQS_in and /DQS_in by monitoring the signals DQS_in and /DQS_in sent from the output control circuit 33. The detection circuit 35 generates, based on a result of the detection, a signal FLG for correction of the duty cycle and sends the generated signal FLG to the sequencer 17.

Having received the signal FLG from the detection circuit 35, the sequencer 17 generates control signals DAC1 and DAC2 based on the signal FLG and sends the generated control signals DAC1 and DAC2 to the logic control circuit 14.

Each semiconductor storage device has a DCC mode in which the DCC processing is executed. The sequencer 17 executes the DCC processing when the DCC mode is set. The DCC processing is executed in accordance with a result of the detection by the detection circuit 35.

The logic control circuit 14 includes the duty cycle correction circuit 25. The duty cycle correction circuit 25 corrects the duty cycle of the signals RE and /RE input through the pads 23_re and 23_bre, respectively, in the logic control pad group 23.

The duty cycle correction circuit 25 generates the signals RE_c and /RE_c by correcting the duty cycle of the signals RE and /RE based on the control signals DAC1 and DAC2 from the sequencer 17. For example, the signals RE_c and /RE_c are sent to the output control circuit 33 and used as a basis of a timing of toggling between the signals DQS and /DQS generated at the output control circuit 33. More specifically, the duty cycle of the signals DQS and /DQS is determined in accordance with the duty cycle of the signals RE_c and /RE_c. For example, the duty cycle of the signals DQS and /DQS is identical to or correlated with the duty cycle of the signals RE_c and /RE_c.

Note that, in an example illustrated in FIG. 3, a case where the signals RE_c and /RE_c are directly sent from the duty cycle correction circuit 25 to the output control circuit 33 is described, but the embodiment is not limited to this example. For example, the duty cycle correction circuit 25 may send the signals RE_c and /RE_c to another circuit (for example, the sequencer 17), and then a timing signal based on the duty cycle of the signals RE_c and /RE_c may be generated at the other circuit. Then, the timing signal may be sent to the output control circuit 33 to generate the signals DQS_in and /DQS_in correlated with the duty cycle of the signals RE_c and /RE_c.

With the configuration as described above, the detection circuit 35 can detect shift of the duty cycle of the signals DQS_in and /DQS_in from a desired value, and the duty cycle correction circuit 25 can correct the duty cycle of the signals RE and /RE based on a result of the detection. Then, a result of the correction is fed back to the output control circuit 33 to correct the duty cycle of the signals DQS_in and /DQS_in, and accordingly, the signals DQS and /DQS having a duty at the desired value can be output.

Figure 4:
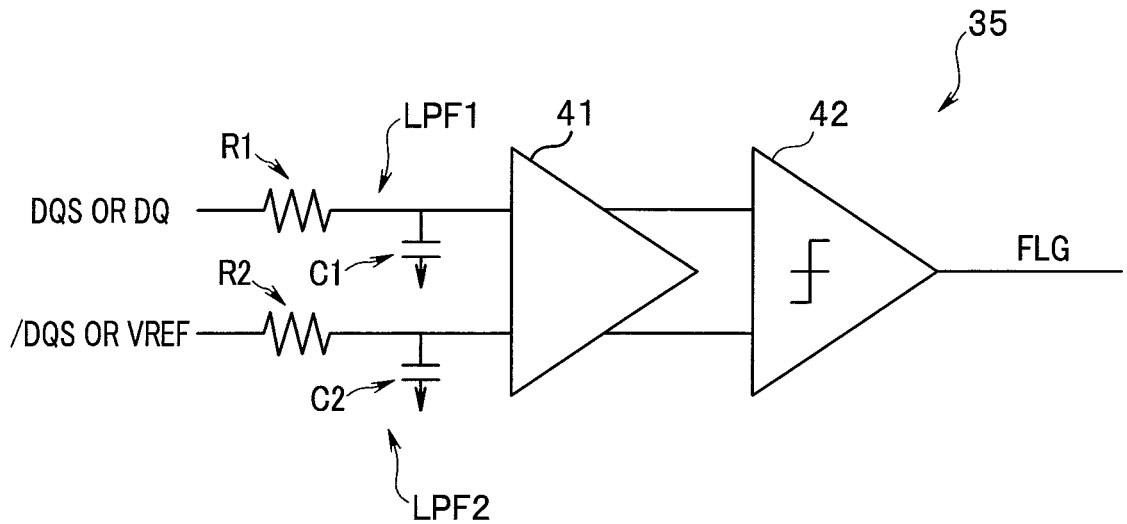
FIG. 4 is a circuit diagram illustrating an example of a detection circuit according to the embodiment.

FIG. 4 is a circuit diagram illustrating one example of the detection circuit 35. As illustrated in FIG. 4, the detection circuit 35 includes a pre-amplifier 41 and a comparator 42. The pre-amplifier 41 includes two inputs. One of the two inputs is the signal DQS or DQ, and the other is the signal /DQS or a reference voltage VREF. The signal DQS or DQ is input to the pre-amplifier 41 through a lowpass filter LPF1 including a resistor R1 and a capacitor C1. The signal /DQS or the reference voltage VREF is also input to the pre-amplifier 41 through a lowpass filter LPF2 including a resistor R2 and a capacitor C2.

When the signal DQS is to be corrected, two signals, namely, the signals DQS and /DQS are compared. When the signal DQ is to be corrected, two signals, namely, the signal DQ and the reference voltage VREF are compared.

Two input signals are amplified by the pre-amplifier 41 and input to the comparator 42. The comparator 42 outputs FLG "0" when one of the two input signals is higher than the other, or outputs FLG "1" when the one of the two input signals is lower than the other.

During execution of the DCC processing, the duty cycle is corrected at the duty cycle correction circuit 25 based on an FLG signal output in accordance with the magnitude relation between the two input signals.

Figure 5:
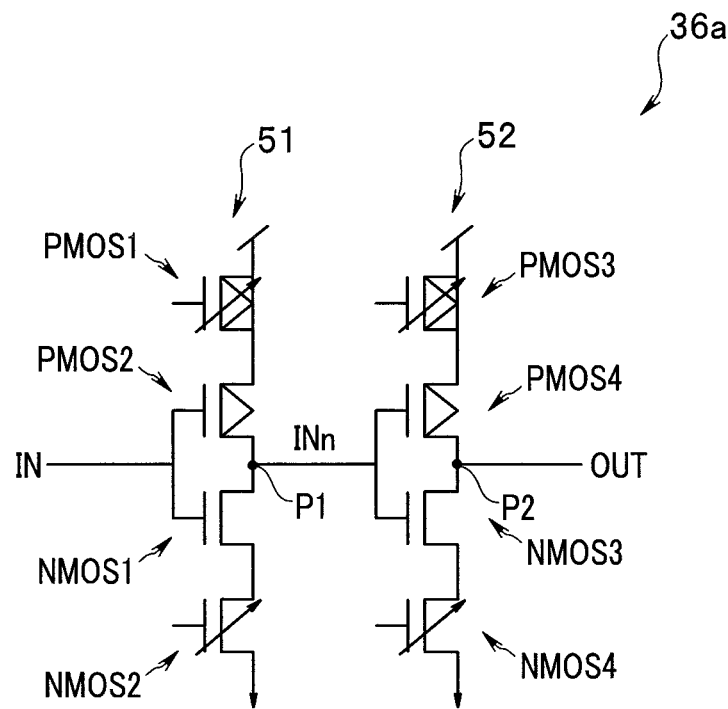
FIG. 5 is a circuit diagram illustrating an example of a duty cycle adjustment circuit included in a duty cycle correction circuit according to the embodiment.

FIG. 5 is a circuit diagram illustrating an example of a duty cycle adjustment circuit 36a included in the duty cycle correction circuit 25. The duty cycle adjustment circuit 36a adjusts the duty cycle of an input signal IN. As illustrated in FIG. 5, the duty cycle adjustment circuit 36a includes an adjustment circuit 51 including PMOS transistors PMOS1 and PMOS2 and NMOS transistors NMOS1 and NMOS2 connected in series, and a second adjustment circuit 52 including PMOS transistors PMOS3 and PMOS4 and NMOS transistors NMOS3 and NMOS4 connected in series. The PMOS transistors PMOS1 and PMOS3 and the NMOS transistors NMOS2 and NMOS4 are transistor groups each capable of adjusting current flowing between a source and a drain.

In the adjustment circuit 51, a source of the PMOS transistor PMOS1 is connected to a predetermined voltage. A drain of the PMOS transistor PMOS1 and a source of the PMOS transistor PMOS2 are connected to each other. A drain of the PMOS transistor PMOS2 and a drain of the NMOS transistor NMOS1 are connected to each other. A source of the NMOS transistor NMOS1 and a drain of the NMOS transistor NMOS2 are connected to each other. A source of the NMOS transistor NMOS2 is grounded.

In the adjustment circuit 52, a source of the PMOS transistor PMOS3 is connected to a predetermined voltage. A drain of the PMOS transistor PMOS3 and a source of the PMOS transistor PMOS4 are connected to each other. A drain of the PMOS transistor PMOS4 and a drain of the NMOS transistor NMOS3 are connected to each other. A source of the NMOS transistor NMOS3 and a drain of the NMOS transistor NMOS4 are connected to each other. A source of the NMOS transistor NMOS4 is grounded.

The input signal IN is input to a gate of the PMOS transistor PMOS2 and a gate of the NMOS transistor NMOS1.

A connection point P1 between the drain of the PMOS transistor PMOS2 and the drain of the NMOS transistor NMOS1 is connected to a gate of the PMOS transistor PMOS4 and a gate of the NMOS transistor NMOS3.

A connection point P2 between the drain of the PMOS transistor PMOS4 and the drain of the NMOS transistor NMOS3 is a node that outputs an output signal OUT.

As described above, during the DCC processing, the sequencer 17 corrects the duty cycle by generating the control signals DAC1 and DAC2 based on an output signal from the detection circuit 35 and outputting the generated control signals DAC1 and DAC2 to the duty cycle adjustment circuit 36a.

The control signals DAC1 and DAC2 from the sequencer 17 are supplied to any of gates of the PMOS transistors PMOS1 and PMOS3 and the NMOS transistors NMOS2 and NMOS4.

After the DCC processing, the PMOS transistors PMOS1 and PMOS3 and the NMOS transistors NMOS2 and NMOS4 operate to continue flowing adjusted current.

Figure 6:
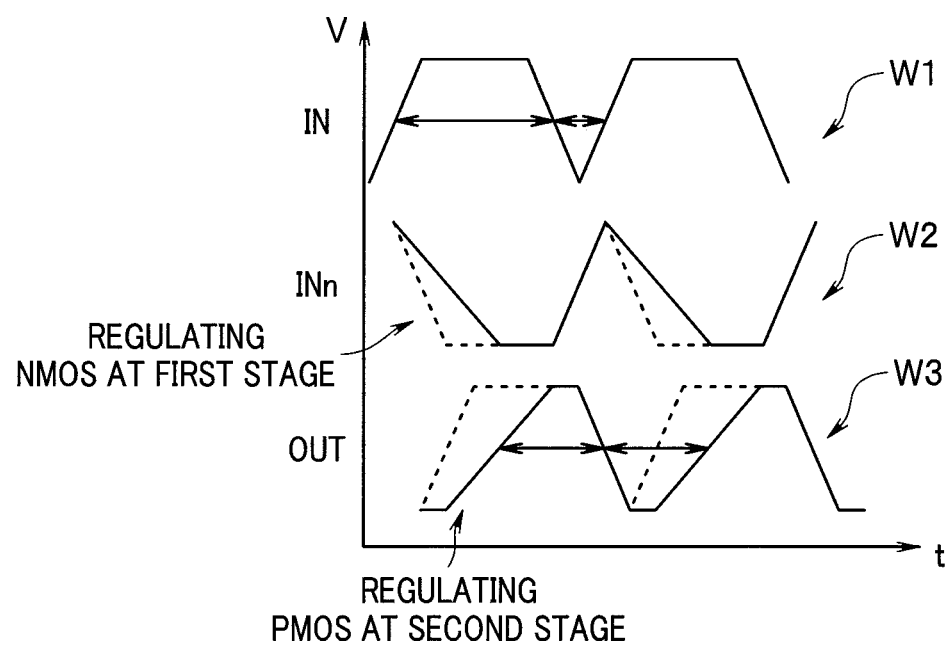
FIG. 6 is a waveform diagram of an input signal, a signal at a connection point, and an output signal according to the embodiment.

FIG. 6 is a waveform diagram of the input signal IN, a signal INn at the connection point P1, and the output signal OUT.

The number of transistors turned on in the transistor group included in the PMOS transistors PMOS1 and PMOS3 and the NMOS transistors NMOS2 and NMOS4 is adjusted in accordance with the control signals DAC1 and DAC2 to correct the duty cycle of the input signal IN to be 50%.

In FIG. 6, a waveform W1 is the waveform of the input signal IN, a waveform W2 is the waveform of the signal INn at the connection point P1, and a waveform W3 is the waveform of the output signal OUT. For example, the waveform W2 is generated by regulating the NMOS transistor NMOS2 of the adjustment circuit 51 to decrease current flowing therethrough. The waveform W3 is generated by regulating the PMOS transistor PMOS3 of the adjustment circuit 52 to decrease current flowing therethrough.

Effects

Subsequently, the DCC processing (duty cycle correction processing) at each semiconductor storage device will be described.

Figure 7:
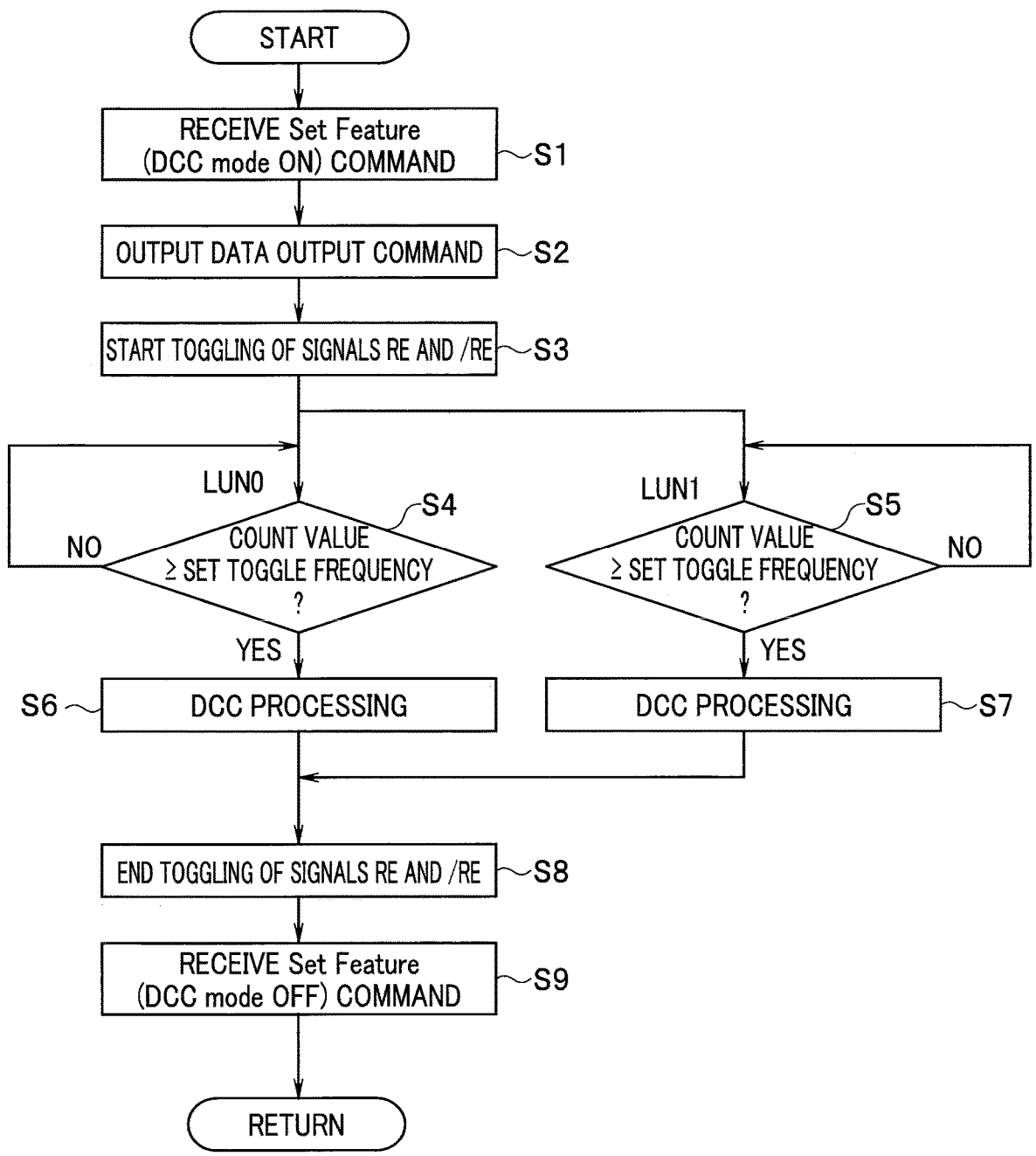
FIG. 7 is a flowchart of duty cycle correction processing in the memory system according to the embodiment.

FIG. 7 is a flowchart of the duty cycle correction processing in the memory system 1. The processing illustrated in FIG. 7 is executed by the controller 2 and the sequencer 17.

As described above, the set toggle frequency ST is set in advance to the timing information storage circuit 17a of the sequencer 17 as information on the start timing of the DCC processing at each semiconductor storage device. In other words, the sequencer 17 stores information of the set toggle frequency ST. The set toggle frequency ST is a set value of a frequency that the signal RE (or /RE) received toggles.

In other words, the set toggle frequency ST is set for each LUN. In an example below, a set toggle frequency ST1 of the LUN 0 is "1", and a set toggle frequency ST2 of the LUN 1 is "n" (n is an integer). The integer n is, for example, a count value corresponding to half of a data output duration DT in which one page of data is output. The integer n may be any value that changes the start timing of the DCC processing.

The host 4 outputs a Set Feature command that sets on a DCC processing mode to the controller 2. The Set Feature command includes information that specifies a target at which the DCC processing is to be executed.

The controller 2 receives the Set Feature command (step S1). The controller 2 sets two semiconductor storage devices at the target to the DCC processing mode based on the Set Feature command.

Subsequently, the controller 2 outputs a data output command to the two semiconductor storage devices at the target (step S2) and starts toggling of the signals RE and /RE (step S3).

In a semiconductor storage device of the LUN 0, the sequencer 17 counts a toggle frequency of toggling of the signals RE and /RE and determines whether this count value has become equal to or larger than a set toggle frequency ST0 (step S4). When the count value is not equal to nor larger than the set toggle frequency ST0, the sequencer 17 executes no processing.

In a semiconductor storage device of the LUN 1, as well, the sequencer 17 counts the toggle frequency of toggling of the signals RE and /RE and determines whether this count value has become equal to or larger than the set toggle frequency ST1 (step S6). When the count value is not equal to nor larger than the set toggle frequency ST1, the sequencer 17 executes no processing.

In the semiconductor storage device of the LUN 0, when the count value has become equal to or larger than the set toggle frequency ST0 (YES at step S4), the sequencer 17 starts execution of the DCC processing (step S6).

In the semiconductor storage device of the LUN 1, when the count value has become equal to or larger than the set toggle frequency ST1 (YES at step S5), the sequencer 17 starts execution of the DCC processing (step S7).

After step S6 or S7, the controller 2 ends toggling output of the signals RE and /RE (step S8).

After step S8, the host 4 outputs a Set Feature command that sets off the DCC processing mode to the controller 2 (step S9).

As described above, the DCC processing corrects the duty cycle of the signals /RE and RE based on a result of the detection by the detection circuit 35.

Note that no data is output to the controller 2 during the DCC processing.

Figure 8:
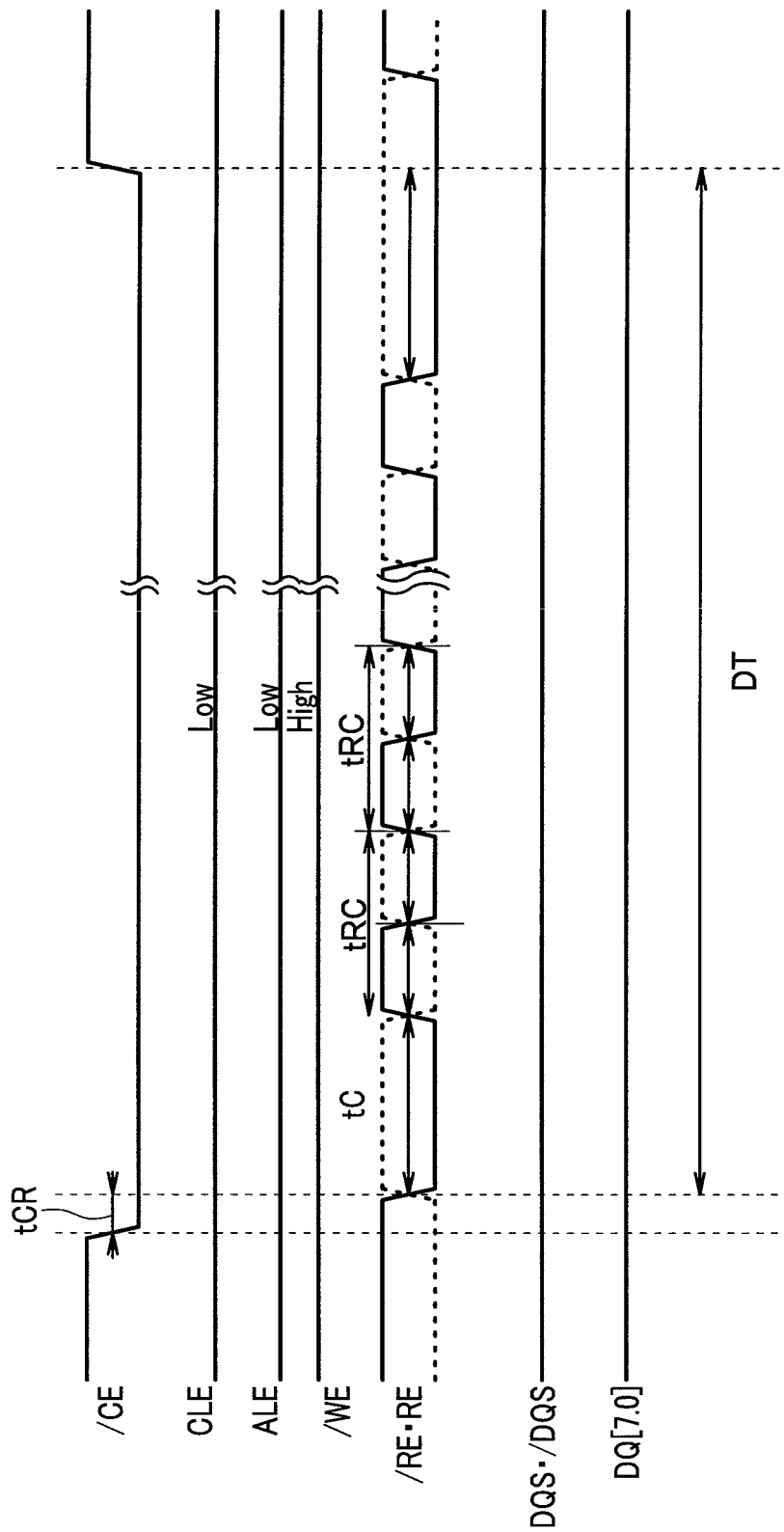
FIG. 8 is a signal waveform diagram of various signals according to the embodiment.

FIG. 8 is a signal waveform diagram of signals /CE, CLE, ALE, /WE, /RE (RE), DQS, /DQS, and DQ[7:0].

When the signal /CE becomes "Low" and two semiconductor storage devices at a target are enabled, the sequencer 17 receives a data output command after elapse of a time period tCR. The data output command is output in a duration tC.

The data output duration DT is started after the reception duration tC ends. After the end of the reception duration tC, toggling of the signals /RE and RE is started. In FIG. 8, the toggling occurs once in a duration tRC. The sequencer 17 monitors the signal RE (or /RE) and counts a frequency of the toggling of the signal RE (or /RE) (that is, change of the signal from "High" to "Low" or from "Low" to "High"). In other words, the signal RE (or /RE) is a signal having a voltage level that alternately toggles between a "High" level and a "Low" level.

When the toggling frequency has become equal to or larger than the set toggle frequency ST, the sequencer 17 starts execution of the DCC processing by controlling the duty cycle correction circuit 25 in accordance with a result of the detection by the detection circuit 35.

In other words, in the semiconductor storage device of each LUN, execution of the DCC processing is started when the toggling frequency counted by the sequencer 17 has become equal to or larger than a toggling frequency set for the LUN.

As described above, when a command (for Set Feature) related to execution of the correction processing is received, the sequencer 17 in the semiconductor storage device of each of the LUNs 0 and 1 starts execution of the DCC processing based on the set toggle frequency ST stored in the timing information storage circuit 17a. In the semiconductor storage devices of the LUNs 0 and 1, execution of the DCC processing is started based on the set toggle frequencies ST0 and ST1, and then the DCC processing ends.

Figure 9:
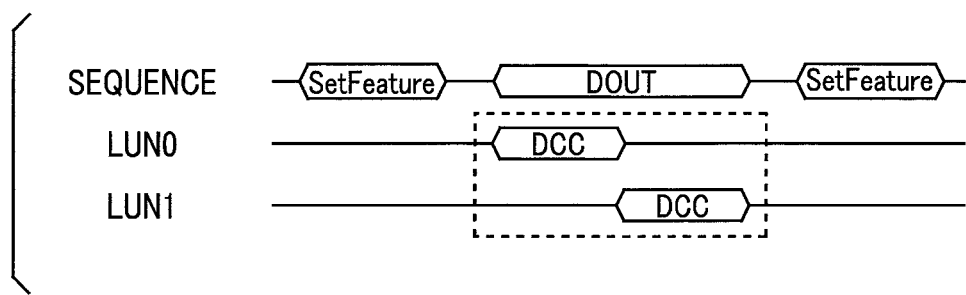
FIG. 9 is a diagram illustrating an example of an execution sequence of the duty cycle correction processing according to the embodiment.

FIG. 9 is a diagram illustrating an example of the above-described execution sequence of the DCC processing. As illustrated in FIG. 9, the set toggle frequency ST0 for the LUN 0 is "1", and thus the sequencer 17 of the LUN 0 executes the DCC processing right after having received a DCC command from the controller 2. In this example, an execution time period of the DCC processing is equal to or shorter than half of the data output duration DT. The set toggle frequency ST1 for the LUN 1 is set to be a toggling frequency corresponding to a time period substantially half of the data output duration DT. Thus, the DCC processing for the LUN 1 is executed at a timing when the time period substantially half of the data output duration DT has elapsed. In other words, execution of the DCC processing for the LUN 1 is started not at start of the data output duration DT but at any timing when a predetermined duration of the data output duration DT has elapsed.

Accordingly, the DCC processing at the semiconductor storage device of the LUN 0 is executed in a first half of the data output duration DT, and then the DCC processing at the semiconductor storage device of the LUN 1 is executed in a second half of the data output duration DT after end of the DCC processing at the semiconductor storage device of the LUN 0.

The semiconductor storage device CP1 of the LUN 0 and the semiconductor storage device CP2 of the LUN 1 receive the signals /RE and RE in common, and thus execution timings of the DCC processing are synchronized.

Accordingly, in the embodiment described above, upon one execution command of the DCC processing (in this example, DCC mode setting with a Set Feature command), the DCC processing is executed in a plurality of semiconductor storage devices at execution timings shifted from one another, and thus occurrence of peak current can be prevented.

In the above-described example, one target has the two semiconductor storage devices of the LUN 0 and 1, but when one target has four semiconductor storage devices (that is, four LUNs), the set toggle frequency ST of each LUN may be set so that the DCC processing is executed for each group of a predetermined number of LUNs.

Figure 10:
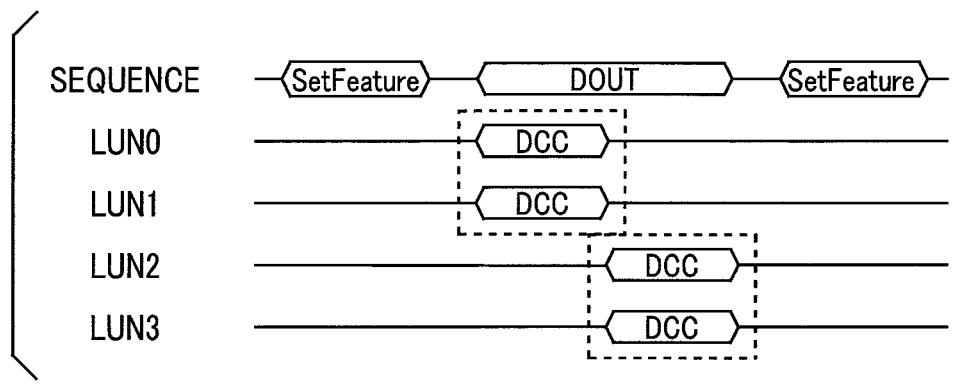
FIG. 10 is a diagram illustrating an example of the execution sequence of the duty cycle correction processing according to the embodiment when one target has four logical unit numbers (LUNs)

FIG. 10 is a diagram illustrating an example of the execution sequence of the DCC processing when one target has four LUNs.

In FIG. 10, the set toggle frequencies ST0 and ST1 of the LUN 0 and 1 are set to be zero, and the set toggle frequencies ST2 and ST3 of the LUNs 2 and 3 are both set to be a frequency (n/2) corresponding to a time period (DT/2) half of the data output duration DT.

Accordingly, the DCC processing is first simultaneously executed at the two semiconductor storage devices of the LUNs 0 and 1, and the DCC processing is then simultaneously executed at the two semiconductor storage devices of the LUNs 3 and 4 after the DCC processing at the two semiconductor storage devices of the LUNs 0 and 1 has ended.

In FIG. 10, the DCC processing is simultaneously executed at two of the four LUNs 0, 1, 2, and 3, but the set toggle frequencies ST0, ST1, ST2, and ST3 of the four LUNs may be different from one another.

Figure 11:
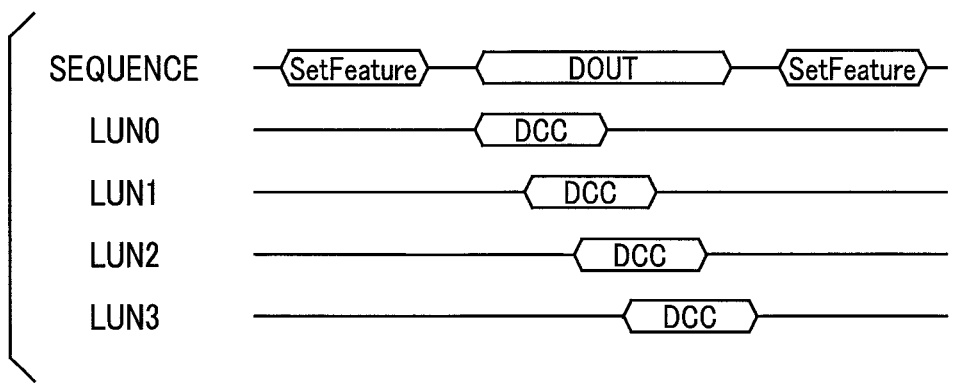
FIG. 11 is a diagram illustrating an example of the execution sequence of the duty cycle correction processing according to the embodiment when one target has four logical unit numbers (LUNs)

FIG. 11 is a diagram illustrating an example of the execution sequence of the DCC processing when four pieces of the DCC processing are sequentially executed for four LUNs at times shifted from one another in the data output duration DT in a case where one target has the four LUNs.

In FIG. 11, the set toggle frequencies ST0, ST1, ST2, and ST3 of the four LUNs are different from one another so that execution of four pieces of the DCC processing in the four semiconductor storage devices of the LUNs 0, 1, 2, and 3 is started at times shifted from each other by a predetermined time period and the four pieces of the DCC processing end in the data output duration DT.

As described above, various execution orders and combinations of the DCC processing can be set by adjusting the set toggle frequency ST of each LUN.

Note that, in the above-described example, the set toggle frequency ST of each semiconductor storage device is stored in the sequencer 17, but may be stored in a predetermined storage region of the memory cell array 11 and read from the memory cell array 11 by the sequencer 17.

Note that, in the above-described example, the set toggle frequency ST is stored in the semiconductor storage devices of each LUN, but may be stored in only a semiconductor storage device at which start of execution of the DCC processing is delayed. In this case, only for the semiconductor storage device storing the set toggle frequency ST, start of execution of the DCC processing is determined based on the set toggle frequency ST, and execution of the DCC processing is started at any other semiconductor storage devices not storing the set toggle frequency ST right after the semiconductor storage device is set to the DCC mode.

As described above, according to the above-described embodiment, it is possible to provide a semiconductor device that can prevent occurrence of peak current and execute the duty cycle correction processing in a short time period when the duty cycle correction processing is executed at a plurality of semiconductor devices based on a command.

Subsequently, modifications of the above-described embodiment will be described.

Modification 1

In the above-described embodiment, the host 4 sets each LUN to the DCC mode by using a Set Feature command and the DCC processing is executed for each LUN, but the host 4 may cause execution of the DCC processing for each LUN by using a dedicated command (hereinafter, referred to as DCC dedicated command) that causes the DCC processing to be executed.

Figure 12:
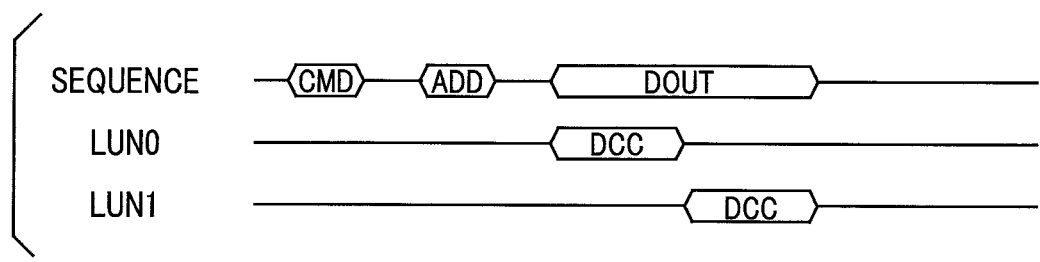
FIG. 12 is a diagram illustrating an example of the execution sequence of the duty cycle correction processing in Modification 1 of the embodiment.

FIG. 12 is a diagram illustrating an example of the execution sequence of the DCC processing in the present modification 1. One target has two LUNs in the example of the execution sequence of the DCC processing illustrated in FIG. 12.

The host 4 outputs a DCC dedicated command CMD and an address (target address) ADD to the controller 2.

The controller 2 instructs, based on the DCC dedicated command CMD, each LUN to execute the DCC processing, and the sequencer 17 of each LUN executes the DCC processing when a counted toggling frequency has become equal to or larger than the set toggle frequency ST. In this example, the set toggle frequency ST1 for the LUN 1 is set to be a toggling frequency corresponding to substantially half of the data output duration DT.

Processing executed by the controller 2 and the sequencer 17 in the present modification is substantially same as the processing in FIG. 7 except that a DCC dedicated command is received in place of a Set Feature command.

According to the present modification 1 as well, it is possible to obtain effects same as effects of the above-described embodiment.

Modification 2

In the above-described embodiment, each semiconductor storage device only executes the DCC processing in accordance with a command, but in the present modification 2, the ODT circuit 13a is turned on to prevent reflection of the signals /RE and RE in parallel to execution of the DCC processing.

Figure 13:
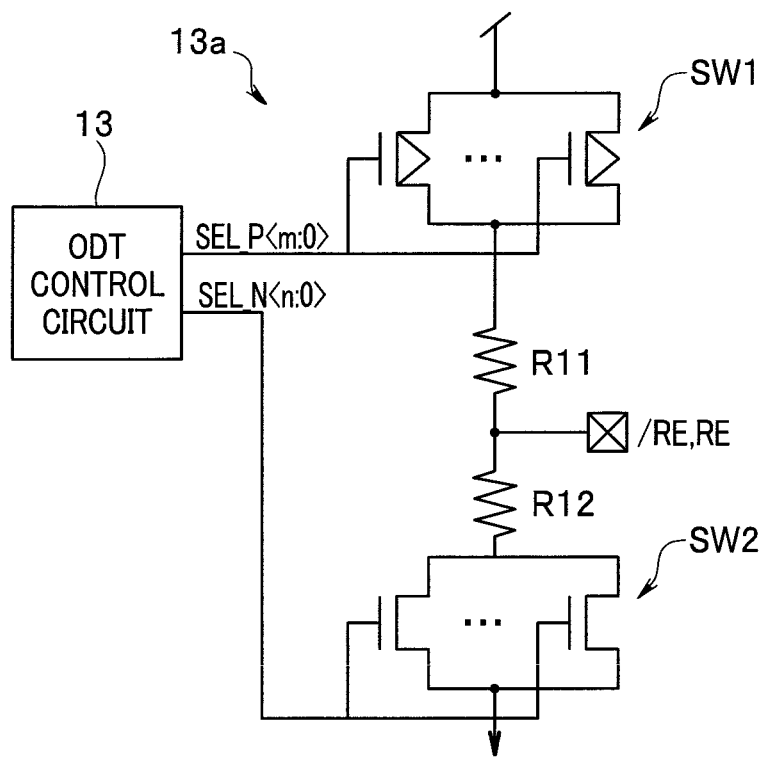
FIG. 13 is a circuit diagram of an ODT circuit provided at an input terminal of each of signals /RE and RE in Modification 2 of the embodiment.

FIG. 13 is a circuit diagram of the ODT circuit 13a provided at an input terminal of each of the signals /RE and RE in the present modification 2. The ODT circuit 13a includes switches SW1 and SW2 and resistors R11 and R12 provided between a power voltage and a ground voltage. The switch SW1 includes a PMOS transistor group connected in parallel. The switch SW2 includes an NMOS transistor group connected in parallel.

The ODT control circuit 13 is connected to the switch SW1 through a plurality of signal lines for a selection signal SEL_P<m:0>. In addition, the ODT control circuit 13 is connected to the switch SW2 through a plurality of signal lines for a selection signal SEL_N<n:0>.

When signal reflection is to be prevented, the ODT control circuit 13 controls "on" and "off" of the PMOS transistor group in the switch SW1 and the NMOS transistor group in the switch SW2 by controlling a gate voltage of each of the PMOS and NOS transistors with a selection signal.

The ODT control circuit 13 operates in accordance with a control signal from the sequencer 17.

In the present modification 2, the sequencer 17 operates the ODT circuit provided at the input terminal of each of the signals /RE and RE in parallel to the DCC processing. In other words, the sequencer 17 operates, together with execution of the DCC processing, the ODT circuit that prevents signal reflection.

Figure 14:
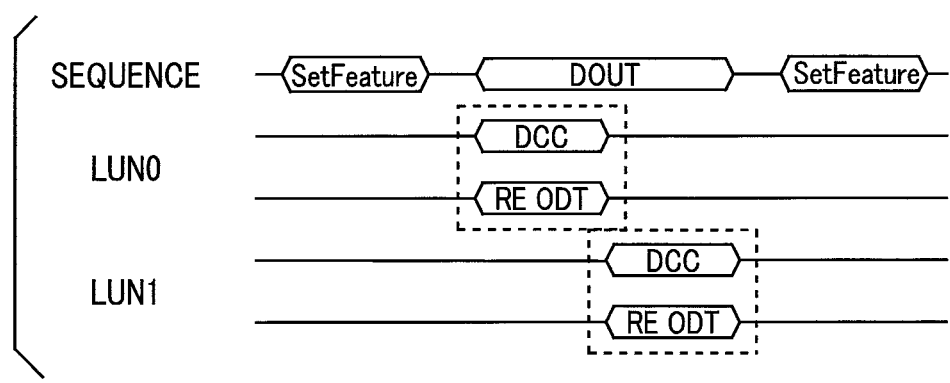
FIG. 14 is a diagram illustrating an example of the execution sequence of the duty cycle correction processing in Modification 2 of the embodiment.

FIG. 14 is a diagram illustrating an example of the execution sequence of the DCC processing according to Modification 2. As illustrated in FIG. 14, the sequencer 17 of the LUN 0 turns on the ODT circuit only while the DCC processing is executed. The sequencer 17 of the LUN 1 turns on the ODT circuit only while the DCC processing is executed.

As described above, the ODT circuit of each LUN is turned in accordance with execution of the DCC processing, thus preventing reflection of the signals /RE and RE. According to the present modification 2 as well, it is possible to obtain effects same as effects of the above-described embodiment.

Modification 3

In the above-described embodiment and the other modifications, the set toggle frequency ST is set to the sequencer 17 in advance, but in the present modification, the set toggle frequency ST can be set from outside other than a semiconductor storage device.

For example, the set toggle frequency ST of each LUN is set by a Set Feature command from the host 4 as an external device.

Figure 15:
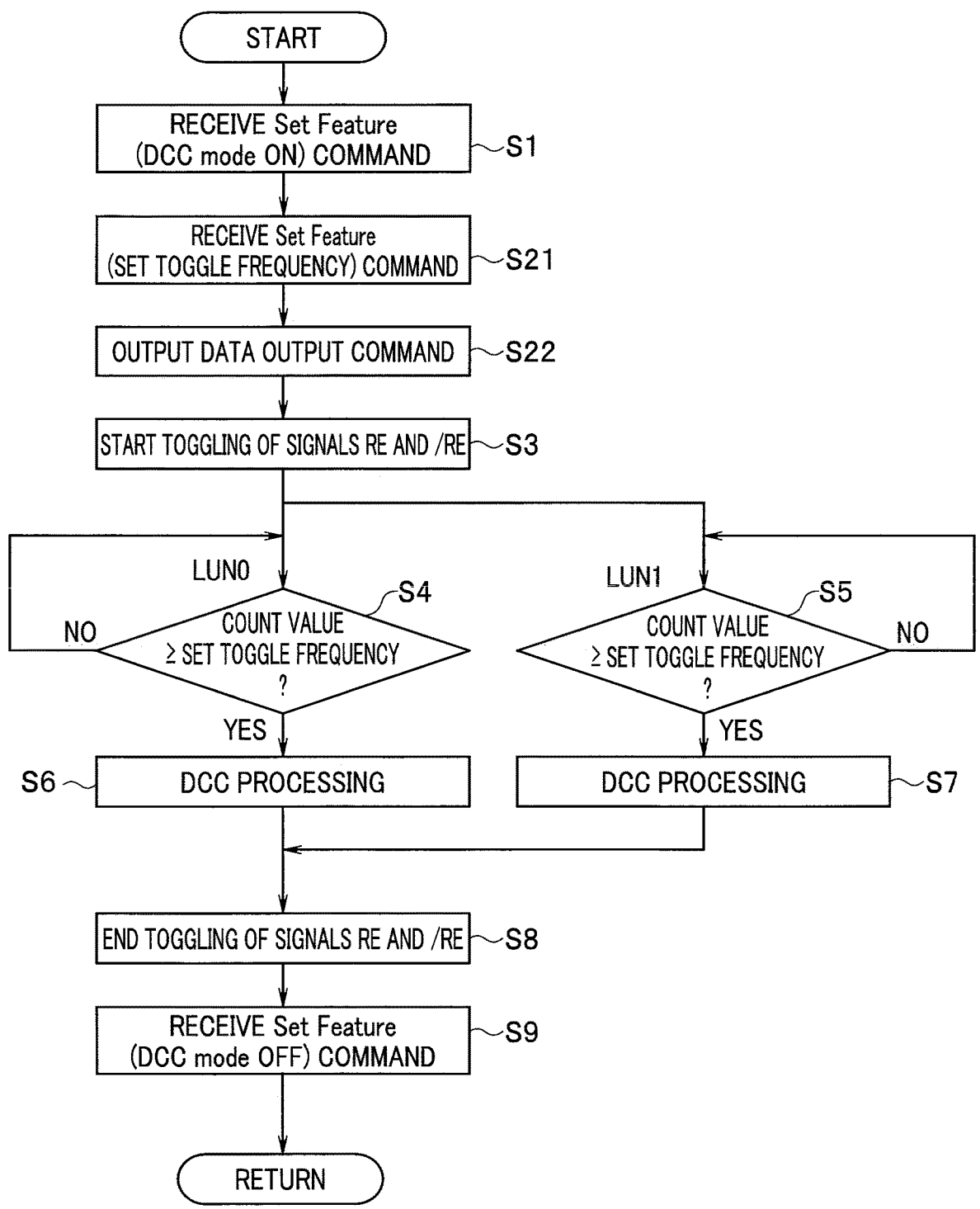
FIG. 15 is a flowchart of the duty cycle correction processing in a memory system 1 when a set toggle frequency ST is set from outside in Modification 3 of the embodiment.

FIG. 15 is a flowchart of the duty cycle correction processing in the memory system 1 when the set toggle frequency ST is set from outside.

The process flow illustrated in FIG. 15 is substantially same as the process flow in FIG. 7 except that a Set Feature command that specifies the set toggle frequency is transmitted from the host 4 after a Set Feature command that sets the DCC mode.

Thus, reception processing of the Set Feature command that specifies the set toggle frequency is executed after processing at S1 (step S11). After step S11, the sequencer 17 executes the processing at S2 and later.

As described above, the set toggle frequency may be set by an external device other than a semiconductor storage device. According to the present modification 3 as well, it is possible to obtain effects same as effects of the above-described embodiment.

Modification 4

In the example illustrated in FIG. 10 of the above-described embodiment, the DCC processing is simultaneously executed for LUNs determined in advance, but when a plurality of LUNs exist, the number of LUNs for which the DCC processing is simultaneously executed may be set from outside other than a semiconductor storage device.

For example, the number (referred to as simultaneous execution number) of LUNs for which the DCC processing is simultaneously executed is set by a Set Feature command from the host 4.

Figure 16:
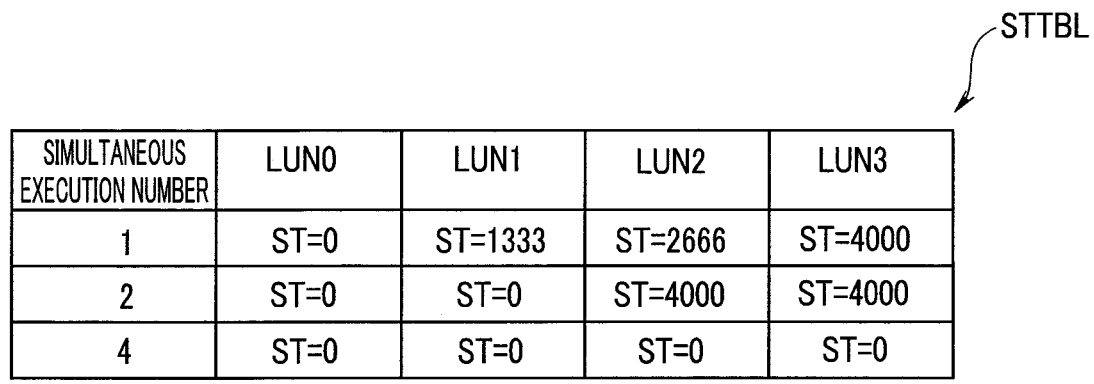
FIG. 16 is a diagram illustrating table data in which information of a set toggle frequency in accordance with a simultaneous execution number is stored in Modification 4 of the embodiment.

For example, when one target includes four semiconductor storage devices, the timing information storage circuit 17a of the sequencer 17 of each semiconductor storage device stores table data STTBL as illustrated in FIG. 16. FIG. 16 is a diagram illustrating the table data STTBL storing information of the set toggle frequency in accordance with the simultaneous execution number. For example, for the LUN 2 in the table data STTBL, the set toggle frequency ST of "2666", "4000", and "0" are stored for received simultaneous execution numbers "1", "2", and "4", respectively.

Figure 17:
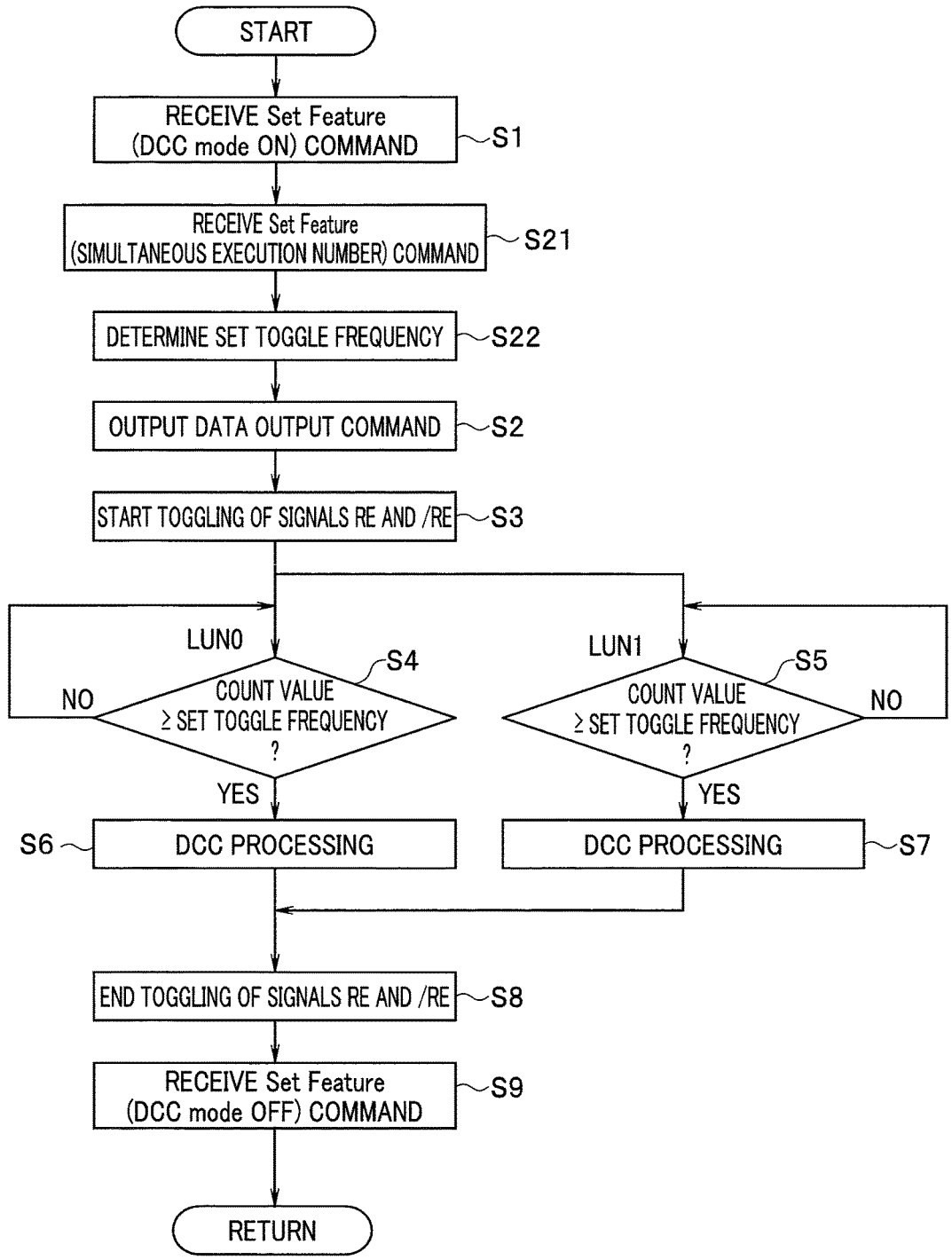
FIG. 17 is a flowchart of the duty cycle correction processing in the memory system when the number of simultaneously executed logical unit numbers (LUNs) is set from outside in Modification 4 of the embodiment.

FIG. 17 is a flowchart of the duty cycle correction processing in the memory system 1 when the number of LUNs in simultaneous execution is set from outside.

The process flow illustrated in FIG. 17 is substantially same as the process flow illustrated in FIG. 7 except that a Set Feature command that specifies the simultaneous execution number is transmitted from the host 4 after a Set Feature command that sets the DCC mode (step S21).

The sequencer 17 determines the set toggle frequency ST by referring to the table data STTBL based on the received simultaneous execution number (step S22).

As described above, the sequencer 17 determines the start timing of the DCC processing based on the simultaneous execution number that is set from outside and timing information of the table data STTBL stored in the timing information storage circuit 17a. After the timing is determined, the sequencer 17 executes the processing at S2 and later in FIG. 7.

For example, when the simultaneous execution number is one, the four semiconductor storage devices (LUNs 0 to 3) execute the DCC processing as illustrated in FIG. 11. When the simultaneous execution number is two, the four semiconductor storage devices (LUNs 0 to 3) execute the DCC processing as illustrated in FIG. 10. When the simultaneous execution number is four, the four semiconductor storage devices (LUNs 0 to 3) simultaneously execute the DCC processing.

As described above, the simultaneous execution number may be set from an external device other than a semiconductor storage device. According to the present modification 4 as well, it is possible to obtain effects same as effects of the above-described embodiment.

As described above, the above-described embodiment and the respective modifications provide a semiconductor device that can prevent occurrence of peak current and execute the duty cycle correction processing at a plurality of semiconductor devices in a short time period, and a method of correcting the duty cycle of an output signal from the semiconductor device.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
   an input circuit to which a signal is input;
   a timing information storage circuit configured to store timing information related to a start timing of correction processing that corrects a duty cycle of the signal; and
   a control circuit configured to start the correction processing in response to a command instructing execution of the correction processing to correct the duty cycle of the signal, at a timing corresponding to the timing information stored in the timing information storage circuit,
   wherein the timing information is a set value of a frequency that the signal received toggles.

2. The semiconductor device according to claim 1, wherein the control circuit includes the timing information storage circuit.

3. The semiconductor device according to claim 1, wherein
   the signal has a voltage level that alternately toggles between a "High" level and a "Low" level,
   the timing information is a set value of a frequency that the signal received toggles, and
   the control circuit counts the frequency that the signal toggles and starts the correction processing when a count value obtained through the counting becomes equal to or larger than the set value.

4. The semiconductor device according to claim 1, wherein the signal is a signal related to a signal that controls an operation timing when data is read from the semiconductor device.

5. The semiconductor device according to claim 4, wherein
   the signal has a voltage level that alternately toggles between a "High" level and a "Low" level,
   the timing information is a set value of a frequency that the signal received toggles, and
   the control circuit counts the frequency that the signal toggles and starts the correction processing when a count value obtained through the counting becomes equal to or larger than the set value.

6. The semiconductor device according to claim 1, wherein the control circuit operates, together with the execution of the correction processing, an ODT circuit configured to prevent reflection of the signal.

7. The semiconductor device according to claim 1, wherein the timing information can be set from outside.

8. The semiconductor device according to claim 1, wherein the control circuit determines the start timing of the correction processing based on a simultaneous execution number that is set from outside and the timing information stored in the timing information storage circuit.

9. A memory system comprising:
   a first semiconductor storage device;
   a second semiconductor storage device; and
   a controller configured to control data writing to and data reading from the first semiconductor storage device and second semiconductor storage device, wherein
   the first semiconductor storage device includes
      a first input circuit to which a signal from the controller is input,
      a first timing information storage circuit configured to store first timing information related to a start timing of first correction processing that corrects a duty cycle of the signal in the first semiconductor storage device, and
      a first control circuit configured to start the first correction processing in response to a command instructing execution of the first correction processing, the first correction processing being started at a first timing corresponding to the first timing information, and
   the second semiconductor storage device includes
      a second input circuit to which a signal from the controller is input,
      a second timing information storage circuit configured to store second timing information related to a start timing of second correction processing that corrects a duty cycle of the signal in the second semiconductor storage device, and
      a second control circuit configured to start the second correction processing in response to the command, the second correction processing being started at a second timing corresponding to the second timing information.

10. The memory system according to claim 9, wherein the first timing information and the second timing information are different from each other so that the first timing and the second timing are shifted from each other.

11. A method of correcting a duty cycle of an output signal from a semiconductor device, the method comprising:
    inputting a signal;
    receiving a command instructing execution of correction processing that corrects a duty cycle of the input signal; and
    starting the correction processing in response to the command at a timing corresponding to timing information related to a start timing of the correction processing, the time information being stored in a timing information storage circuit,
    wherein the timing information is a set value of a frequency that the signal received toggles.

12. The method according to claim 11, comprising determining the start timing of the correction processing based on a simultaneous execution number that is set from outside.

* * * * *